United States Patent
Godfrey

(10) Patent No.: US 11,287,336 B2
(45) Date of Patent: Mar. 29, 2022

(54) MONITORING SUBSEA CABLES

(71) Applicant: OPTASENSE HOLDINGS LIMITED, Farnborough (GB)

(72) Inventor: Alastair Godfrey, Farnborough (GB)

(73) Assignee: Optasense Holdings Limited

(*) Notice: Subject to any disclaimer, the term of this patent is extended or adjusted under 35 U.S.C. 154(b) by 264 days.

(21) Appl. No.: 16/488,467

(22) PCT Filed: Feb. 9, 2018

(86) PCT No.: PCT/GB2018/050366
§ 371 (c)(1),
(2) Date: Aug. 23, 2019

(87) PCT Pub. No.: WO2018/154275
PCT Pub. Date: Aug. 30, 2018

(65) Prior Publication Data
US 2020/0249106 A1 Aug. 6, 2020

(30) Foreign Application Priority Data

Feb. 24, 2017 (GB) .................................... 1703051

(51) Int. Cl.
*G01L 1/24* (2006.01)
*G01D 5/353* (2006.01)
(Continued)

(52) U.S. Cl.
CPC ............ *G01L 1/24* (2013.01); *G01D 5/35361* (2013.01); *G01R 31/083* (2013.01); *H02G 9/02* (2013.01)

(58) Field of Classification Search
CPC ..... G01L 1/24; G01D 5/35361; G01R 31/083
See application file for complete search history.

(56) References Cited

U.S. PATENT DOCUMENTS 4,807,199 A 2/1989 Yamamoto et al.
5,243,565 A 9/1993 Yamamoto
(Continued)

FOREIGN PATENT DOCUMENTS

GB 2442745 4/2008
JP 2001507446 6/2001
(Continued)

OTHER PUBLICATIONS

Arkwright, John William, et al. "Fiber optic pressure sensing arrays for monitoring horizontal and vertical pressures generated by traveling water waves." IEEE Sensors Journal 14.8 (2014): 2739-2742. (Year: 2014).*

(Continued)

*Primary Examiner* — Dominic J Bologna
(74) *Attorney, Agent, or Firm* — McDonnell Boehnen Hulbert & Berghott LLP

(57) ABSTRACT

This applications relates to methods and apparatus monitoring of subsea cables (100), for example subsea power or telecommunication cables, and in particular to determining a burial status for such cables. The method involves interrogating a sensing optical fibre (107) with an interrogator unit (108) to perform distributed fibre optic sensing. The sensing optical fibre (107) is deployed along the path of the subsea cable (100) and may, in some instances, form part of the subsea cable. A frequency spectrum of the respective measurement signal from at least one sensing portion of the sensing fibre (107), which corresponds to pressure variations (ΔP(t)) due to surface water waves (109) to determine a burial status. High frequency components of the pressure variation that are detected in any unburied section (106) are attenuated in buried sections (105).

20 Claims, 2 Drawing Sheets

(51) Int. Cl.
*G01R 31/08* (2020.01)
*H02G 9/02* (2006.01)

(56) References Cited

U.S. PATENT DOCUMENTS

| | | | | |
|---|---|---|---|---|
| 2008/0193126 | A1* | 8/2008 | Yamamoto | G01L 1/242 398/34 |
| 2012/0280117 | A1* | 11/2012 | Lewis | G01D 5/35345 250/227.17 |
| 2014/0022530 | A1 | 1/2014 | Farhadiroushan | |
| 2014/0355383 | A1* | 12/2014 | McEwen-King | G01V 1/3852 367/88 |
| 2018/0094952 | A1* | 4/2018 | Handerek | G01D 5/35361 |

FOREIGN PATENT DOCUMENTS

| | | |
|---|---|---|
| JP | 2012052999 | 3/2012 |
| JP | 2016516467 | 6/2016 |
| WO | WO 2012/137021 | 10/2012 |
| WO | WO 2012/137022 | 10/2012 |
| WO | WO 2016/174410 | 11/2016 |
| WO | WO 2017/001826 | 1/2017 |

OTHER PUBLICATIONS

Choi, Kyoo Nam, Juan Carlos Juarez, and Henry Fuller Taylor. "Distributed fiber optic pressure/seismic sensor for low-cost monitoring of long perimeters." Unattended Ground Sensor Technologies and Applications V. Vol. 5090. International Society for Optics and Photonics, 2003. (Year: 2003).*

Fu, Changjing, et al. "Dynamic pressure of seabed around buried pipelines in shallow water." Mathematical Problems in Engineering 2015 (2015). (Year: 2015).*

Zhang, Jisheng, et al. "Experimental investigation of wave-driven pore-water pressure and wave attenuation in a sandy seabed." Advances in Mechanical Engineering 8.6 (2016): 1687814016651207. (Year: 2016).*

Japanese Patent Office, Office Action dated Oct. 26, 2021, issued in connection with Japanese Patent Application No. 2019546372, 10 pages.

* cited by examiner

MONITORING SUBSEA CABLES

FIELD OF THE INVENTION

This application relates to methods and apparatus for monitoring of subsea cables, for instance for monitoring of power cables or telecommunication cables, and in particular for monitoring the status of such cables which are deployed buried in the sea floor.

BACKGROUND OF THE INVENTION

There are various applications in which subsea or submarine cables are used for transmission of power and/or communications.

One particular application is for power transmission. For power transmission over distance it is usual to use high voltages on suitable transmission lines to reduce power losses. On land, outside of urban areas, it is typical to transmit power using high voltage AC power distribution using overhead transmission lines. The various conducting lines are suspended so as to be sufficiently far above the ground and away from one another to provide electrical isolation, i.e. the surrounding air acts as an insulator.

For transmission of power across large bodies of water however such suspended transmission lines are not appropriate and thus subsea cables (also referred to as submarine cables) are used. This is becoming increasingly of interest with the growing popularity of offshore power generation, e.g. offshore wind farms and the like.

Power cables for subsea use typically comprise at least one conductor, e.g. a conductor for each AC phase, which is suitable for the required voltage, surrounded by suitable insulation and armouring/protection for the cable. In use the conductors of the power cable may carry very high voltages, of the order of hundreds of kilovolts for example. Thus good quality insulation is required and it is important that the cable is substantially defect free.

Submarine power cables may in some instances be damaged or distorted during use. If a cable is damaged or highly distorted this may degrade the insulation and/or distort the positioning of the conductors and insulation such that, in use with the operating voltage applied to the cable, the insulation may fail. This may result in a high voltage discharge between conductors of the cable, or between a conductor and the environment, i.e. earth, with a significant fault current, e.g. arcing. Such a fault may result in a catastrophic failure of the relevant part of the cable, with potentially explosive failure of the cable.

There are various ways in which a submarine cable could be damaged or become distorted in use. Movement of the cable on the seabed could cause damage of the cable through abrasion or scouring of the outer layers or leading to a high degree of deformation of the cable around a particular feature on the seabed, which can disturb the internal arrangement of the conductors. Cables can also be damaged by interaction with ship/boats anchors or trawlers nets etc. Flow of water around the cable, e.g. due to internal currents, can induce vibration of the fibre known as Vortex induced vibration (VIV). Prolonged VIV can lead to/accelerate fatigue in the power cable and thus accelerate failure.

To avoid these issues the subsea cable may typically be deployed buried in the sediment on the seabed, i.e. the sea floor. This prevents movement of the cable and thus protects from significant abrasion or distortion and should isolate the cable from interactions with anchors/trawler nets and the like.

Due to the difficulty of seabed operations the cable may typically be buried to a relatively shallow depth. Over time following deployment the various currents at the seabed may result in the material of the seabed shifting, which can result in parts of the subsea cable become exposed, which is sometimes referred to as free-spanning. A part of the cable becoming exposed or free-spanning involves the consequent risks of damage and failure discussed above. Such catastrophic failure would result in having to stop power transmission until the damaged section of cable can be repaired. Finding the damaged section of a subsea cable and repairing the cable is a complex and expensive job and the cable itself is typically a very expensive component.

It would therefore be desirable to be able to monitor the burial status of a subsea cable, for instance to determine when part of the cable has become exposed, i.e. is no longer buried in the seabed, to allow remedial action to be taken before damage occurs.

Similar issues also exist for other subsea cables, for example telecommunication cables spanning large bodies of water.

SUMMARY OF THE INVENTION

Embodiments of the present thus relate to methods and apparatus for monitoring of subsea power cables.

According to the present invention there is provided a method of monitoring a subsea cable comprising: performing distributed fibre optic sensing on a sensing optical fibre to provide a measurement signal from each of a plurality of longitudinal sensing portions of the sensing optical fibre, the sensing optical fibre being deployed along the path of the subsea cable; and for at least one sensing portion, analysing a frequency spectrum of the respective measurement signal corresponding to pressure variations due to surface water waves to determine a burial status for that sensing portion.

Analysing the frequency spectrum of the measurement signal may comprises determining an indication of relative attenuation of the measurement signal at different frequencies. The frequency spectrum of the measurement signal may be compared the frequency spectrum to at least one reference frequency spectrum for a known burial status and/or the frequency spectrum for one sensing portion may be compared to a frequency spectrum for a different sensing portion to determine a relative burial status for the two sensing portions. In some instances the energy or amplitude of the measurement signal at a first frequency or within a first frequency band is compared to the energy or amplitude of the measurement signal at a second different frequency or frequency band.

The method may determine a value for a spectrum parameter corresponding to a ratio between signal energy at a first frequency or first frequency band and signal energy at a second frequency or second frequency band. The spectrum parameter may be compared to at least one reference value for a known burial status. The method may comprise determining which of a plurality of reference values for different burial status said spectrum parameter most closely correspond to. In some embodiments the spectrum parameter may be compared to a corresponding spectrum parameter for the measurement signal for another different sensing portion to determine a relative burial status for the two sensing portions.

The first frequency or first frequency band may be a frequency or band of frequencies that is within a low frequency band. The second frequency or second frequency band may be a frequency or range of frequencies that is within a high frequency band. The first frequency may be 0.1 Hz or lower. The second frequency may be 0.1 Hz or higher.

The subsea cable may be a submarine power cable. The sensing optical fibre may, in some implementations, form part of the subsea cable.

In another aspect there is provided an apparatus for monitoring a subsea cable comprising: a distributed fibre optic interrogator unit for interrogating a sensing optical fibre deployed along the path of the subsea cable to provide a measurement signal from each of a plurality of longitudinal sensing portions of the sensing optical fibre; and an analyser configured to analyse, for at least one sensing portion, a frequency spectrum of the respective measurement signal corresponding to pressure variations due to surface water waves to determine a burial status for that sensing portion.

The analyser may be configured to implement any of the variants of the method described above.

DESCRIPTION OF THE DRAWINGS

To aid in further understanding, various embodiments will now be described by way of example only with reference to the accompanying drawings, of which.

DESCRIPTION OF THE INVENTION

Embodiments of the present invention relate to methods and apparatus for monitoring subsea cables to monitor burial status of the subsea cable. Embodiments relate to determining a burial status for the subsea cable by using fibre optic distributed sensing with a sensing optical fibre deployed along the path of the subsea cable to monitor dynamic strains acting on the sensing fibre and analysing the frequency spectrum of the dynamic strains.

Figure 1:
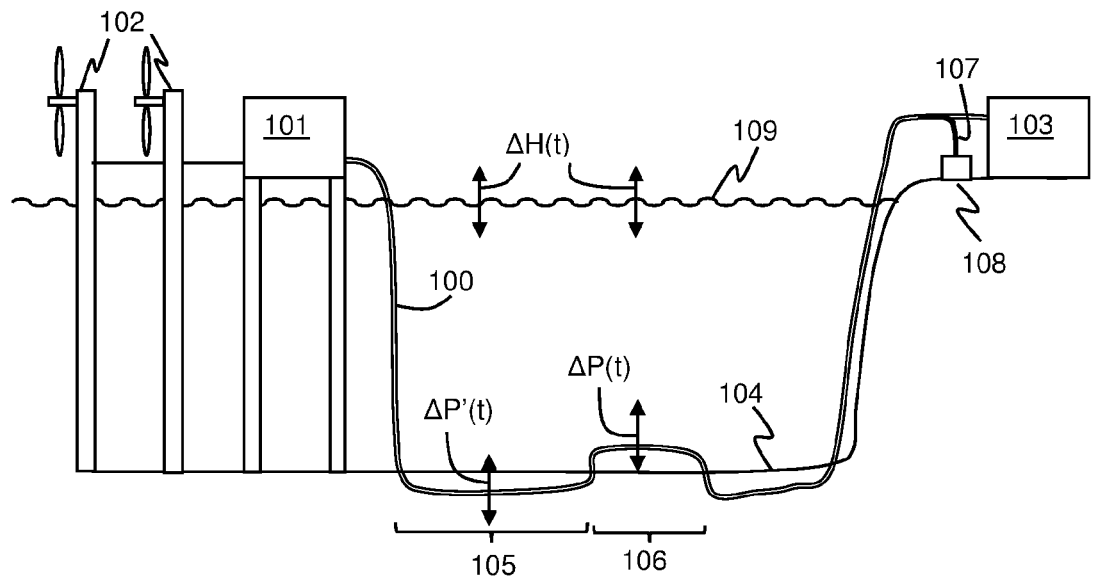
FIG. 1 illustrates an embodiment of monitoring a submarine power cable.
Figure 2:
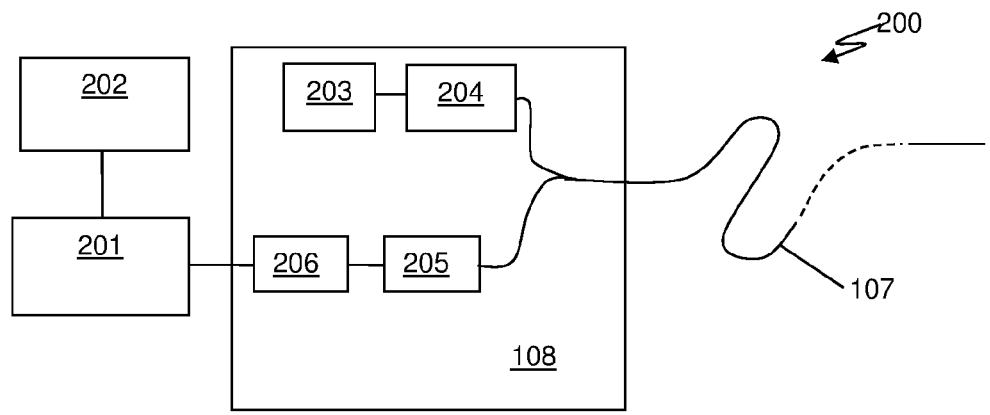
FIG. 2 illustrates a Rayleigh backscatter distributed fibre optic sensor.

FIG. 1 illustrates monitoring of a subsea cable according to an embodiment. As mentioned one particular area of application for subsea cables is for carrying power across bodies of water, e.g. from an offshore power generation site, such as a wind farm, as illustrated in FIG. 1. FIG. 2 illustrates that a first power station 101, which in this example may be located on an off shore platform, may be connected to a local source of power, such as a plurality of wind turbines 102. The first power station 101 may receive electrical power from the wind turbines and in some instances transform the voltage to a high voltage for transmission to an on-shore power station 103 via power cable 100. Power cable 100 may be deployed to run along the sea-bed to shore. In examples such as this wind farm example the first power station 201 may be several kilometres or several tens of kilometres from shore.

As mentioned above the power cable 100 may descend to the seabed or sea floor 104 and may be deployed so as to be buried in the sediment of the sea floor. Burying the power cable 100 will prevent the power cable from moving in use and thus avoid the risk of deformation or scour/abrasion damage to the cable, as well as preventing vortex induced vibrations (VIV) that may impact of the lifespan of the power cable 100.

Burying the power cable 100 also avoids the risk of unwanted interference with the power cable 100 by anchors, trawler nets etc. FIG. 1 illustrates that a first section 105 of the power cable is buried in the seabed 104.

However, subsequent to deployment the various currents at the seabed may result in movement of the sediment which could lead to at least part of the power cable 100 becoming exposed. FIG. 1 illustrates a section 106 of the power cable 100 that has become exposed. A free floating part of a subsea cable is said to be free-spanning and may be subject to VIV, scour damage, the risk of deformation and the risk of interaction with anchors/fishing nets etc.

It would therefore de desirable to able to able to monitor the burial status of the power cable 100 and to determine whether any part of a buried power cable 100 has become exposed.

In the embodiment of FIG. 1 to provide monitoring of burial status of the power cable an optical fibre 107 is deployed along the length of at least part of the power cable 100. The optical fibre 107 is connected at one end to an interrogator unit 108 to provide distributed fibre optic sensing for dynamic strains. FIG. 1 illustrates that the optical fibre 107, which may be referred to as the sensing fibre, is connected to the interrogator unit on land and for clarity shows only part of the sensing fibre. It will be appreciated however that the interrogator unit 108 may in other embodiments be deployed on an off-shore platform or supported on some floating structure or submerged in some waterproof housing. The sensing fibre is deployed to run along the path of the power cable that runs along the seabed 104 and in this example extends at least as far as section 105 of the power cable. In some embodiments the sensing fibre 107 may be coupled to the outside of the power cable but in some embodiments the sensing fibre 107 is formed as part of the power cable 100 in way that the sensing optical fibre is sensitive to strains acting on the power cable.

As will be explained in more detail below distributed fibre optic sensing for dynamic strains, often referred to as distributed acoustic sensing (DAS), is a known technique where the optical fibre 107 is deployed as a sensing fibre and interrogated with optical radiation by interrogator unit 108. Backscatter from within the optical fibre in response to the interrogating radiation is detected and analysed to determine environmental stimuli, and in particular dynamic strains, acting on the fibre. By an appropriate choice of interrogating radiation and analysis the sensing fibre can be effectively divided into a plurality of discrete longitudinal portions. Thus the dynamic strains at each of a plurality of discrete longitudinal portions along the length of the sensing fibre can be independently determined.

Embodiments of the present invention make use of the fact that surface waves on the body of water resulting in corresponding changes in hydrostatic pressure, which may be detected as dynamic strains acting on the sensing fibre. These strains will have a frequency spectrum related to the surface waves, which depends on various factors. The hydrostatic pressure variations may be experienced up to very significant depths in a body of water and may be experienced at the seabed. A sensing fibre deployed in the water at the seabed would thus experience the pressure variation which would be detected as dynamic strains having a certain frequency profile. The hydrostatic pressure variations will also be transmitted through the sediment of the seabed and thus may also be experience by a buried cable. However the transmission of the pressure variation through the seabed will tend to attenuate the pressure variations and the attenuation will be non-linear with frequency in that higher frequencies will be attenuated more strongly than lower frequencies.

Thus by looking at the frequency spectrum detected by a sensing fibre at one or more longitudinal sensing portions, and in particular the relative power in higher frequency components compared to lower frequency components, an indication of whether that sensing portion of the sensing fibre is buried or not may be determined. Given the sensing fibre is co-located with the power cable this also provides an indication of whether the power cable at that location is buried or not. In some embodiments the analysis may also determine an indication of how deeply the sensing fibre, and hence the power cable, is buried.

Referring back to FIG. 1, surface waves on the surface 109 of the body of water will occur. As will be well understood surface waves may occur on any large body of water and may result from various different processes, including weather conditions (e.g. wind, atmospheric pressure, temperature etc.), currents and tidal effects. The surface waves effectively result in the height of water extending above any given point on the seabed varying over time, e.g. having a height variation $\Delta H(t)$. The surface waves will have a frequency spectrum that will depend on the weather conditions, as well as possibly any relevant local geography. This effectively results in a variation, over time, of the amount of water above any point on the seabed and hence a change $\Delta P(t)$ in the hydrostatic pressure exerted by the water at the seabed (or corresponding change in pressure at any depth in the body of water above that point on the seabed).

This pressure variation $\Delta P(t)$ at the seabed thus has a frequency spectrum that corresponds to the frequency of the surface waves and the relative energy across the frequency spectrum tends to maintain the same form with increasing depth in water. That is the proportion of energy at a first higher frequency compared to a second lower frequency would be substantially the same at both a first depth and a second different depth in the water. In other words a plot of energy/amplitude of pressure variation against frequency for a first depth due to surface wave induced pressure variations would be expected to have the same relative form as a corresponding plot at a second depth. If normalised to the same maximum amplitude the two plots would be expected to substantially match.

This pressure variation $\Delta P(t)$ at the seabed will thus result in a pressure variation being applied to the free-spanning section 106 of power cable 100 and the co-located sensing fibre, which will result in a detectable dynamic strain variation.

The pressure variation $\Delta P(t)$ at the surface of the seabed 104 will also result in a pressure variation within the seabed, i.e. within the sediment of the seabed, at least to a certain depth into the seabed. As mentioned above the material of the seabed will tend to attenuate the pressure variation in a non-linear fashion with respect to frequency and will attenuate higher frequencies more strongly, with the attenuation increasing with depth into the seabed. The buried section 105 of power cable 100 will thus also experience a pressure variation over time $\Delta P'(t)$ which will be an attenuated version of the pressure variation $\Delta P(t)$ at the surface of the seabed. In effect the pressure variation at the buried power cable will be based on the pressure variation at the surface of the seabed transformed by a transfer function that depends on depth into the seabed and which is non-linear with respect to frequency. The sensing fibre 107 at the buried section of fibre will thus also experience a dynamic strain, but the relative energy across the frequency spectrum will be different.

The interrogator unit 108 will provide a measurement signal for each of a plurality of sensing portions of the sensing optical fibre 107 indicative of the dynamic strains acting on that sensing portion. These measurement signals may be processed to analyse the frequency spectrum for the measurement signal from a sensing portion so as to determine a burial status.

In some embodiments analysing the frequency spectrum may comprise comparing the energy or amplitude of the measurement signal at a first frequency or within a first frequency band and the energy or amplitude of the measurement signal at a second different frequency or frequency band. Conveniently the first frequency or first frequency band may be a frequency or band of frequencies that is within a low frequency band, i.e. towards the lower end of frequencies that may be expected to result from hydrostatic pressure variations from surface water waves. In some instances the first frequency may be of the order of 0.1 Hz or lower, or of the order of 0.05 Hz or lower. Conveniently the second frequency or second frequency band may be a frequency or range of frequencies that is within a high frequency band, i.e. towards the higher end of frequencies that may be expected to result from hydrostatic pressure variations from surface water waves and that are within the range of frequencies that can be detected by the distributed fibre optic sensor. In some instances the second frequency may be of the order of 0.1 Hz or higher or of the order of 0.15 Hz or higher.

As noted above the attenuation of the pressure variation by the seabed will be greater for higher frequencies than for lower frequencies. By comparing the energy of amplitude in a first, low frequency band with the energy in a second, higher frequency bans the extent of attenuation may be determined.

In some embodiments the processing may determine a value for a spectrum parameter corresponding to ratio between the amplitude at the first frequency or first frequency band and the amplitude at the second frequency or second frequency band, e.g. a spectrum parameter value $R=A1/A2$ where A1 is the amplitude at the first frequency or average amplitude for the first frequency band and A2 is the amplitude at the second frequency or average amplitude for the second frequency band. This spectrum parameter R may be used as an indication of the relative energy of the measurement signals within different frequency bands.

In some instances it may be expected that a first sensing portion of the sensing fibre 107 located at a free-spanning section 106 of cable 100 would provide a first frequency spectrum with a spectrum parameter R within an expected value or range of values for open water. There may also be at least one reference spectrum parameter value for a given burial status, for instance an expected value or range of values for a buried sensing fibre at a certain burial depth. These expected spectrum parameter R could be for instance include theoretical or modelled values and/or range or could be based on historic measurement data. The spectrum parameter value for a given sensing portion could be determined and compared to the known expected value for certain conditions. A spectrum parameter value R that is within the expected range for open water could thus indicate that the relevant sensing portion is located with a free-spanning section of power cable. A spectrum parameter value that matches an expected value for a certain burial depth in the seabed may be determined to be buried at that depth. If the spectrum parameter value indicates a greater attenuation at higher frequencies this could indicate a deeper depth of burial, whereas a spectrum parameter value R which is outside the expected range for open water, but which shows less high frequency attenuation than expected at a first burial depth may be determined to be buried, but at a shallower depth. The method may thus involve determining which of a plurality of reference values for different burial status said spectrum parameter most closely correspond to.

In general the frequency spectrum for a given sensing portion may thus be compared with at least one known or expected reference frequency spectrum to determine the relative degree of attenuation and hence the relative burial depth compared to the reference frequency spectrum. The comparison may be by comparing one or more parameter such as a spectrum parameter value R discussed above but there will be other ways to compare the frequency spectra to determine an estimate of the relative attenuation.

Additionally or alternatively in some embodiments analysing the frequency spectrum may comprise comparing the frequency spectrum of the measurement signal from one sensing portion with the frequency spectrum of the measurement signal from another different sensing portion.

For example consider that a first sensing portion at the section 105 of the power cable 100 that is buried in the seabed. This sensing portion will experience the attenuated pressure variation ΔP'(t) and thus the measurement signal from the first sensing portion will correspond to a first frequency spectrum. A second sensing portion that is also located in section 105 of the power cable and also buried in the ground, would also experience an attenuated pressure varication with the extent of attenuation being largely due to the burial depth. If the second section were buried to the same general depth, the frequency spectrum from the second sensing portion would likely be substantially the same as that from the first sensing portion.

Now consider a third sensing portion of sensing fibre 107 that is located within section 106 of the power cable 100 that is exposed or free-spanning. At this point the pressure variation acting on the sensing fibre is the substantially unattenuated pressure variation ΔP(t) at the seabed. This will result in the measurement signal from such a third sensing portion exhibiting a frequency spectrum with likely greater energy overall but also more relative energy at higher frequencies.

Comparing the frequency spectrum from the third sensing portion with that from the first sensing portion will therefore reveal that there is more energy in total across the whole frequency spectrum for the third sensing portion but in particular that energy in the higher frequency part of the spectrum relative to the lower frequency part of the spectrum is much higher.

In some embodiments comparing the frequency spectrums from two sensing portions may comprise comparing at least one parameter of the frequency spectrums, for instance a spectrum parameter value R indicative of the ratio of low frequency component of the spectrum to a higher frequency component of the spectrum (or vice versa) as discussed above. For example the ratio of first and second frequencies for the third sensing portion at the free-spanning section 106 of cable 100 will indicate significantly more energy at higher frequencies than the corresponding ratio for the first sensing portion in buried section 105 of power cable 100.

The low frequency component and the high frequency component, e.g. a first frequency or frequency band and second frequency or frequency band used to derive a spectrum parameter value R, may be at predetermined frequencies. The predetermined frequencies may be selected as being the most useful frequencies for indicating burial status in this way. The predetermined frequencies could be based on data from a range of burial depths and/or sediment types and/or modelling. In some instance however a first frequency or frequency band and second frequency or frequency band used to derive a spectrum parameter value R, may be selected based on the frequency spectrum obtained from one or more sensing portions, i.e. the frequencies most appropriate for the data under consideration may be selected based on the data itself.

For instance if the frequency spectra from two sensing portions are to be compared a frequency which corresponds to the highest signal amplitude in one or both of the frequency spectrums, or a combined frequency spectrum, may be identified as the first frequency. The highest frequency at which there is significant signal in both spectra may be identified as the second frequency and a spectrum parameter value R derived as the ratio of the amplitude at such first and second frequencies.

Additionally or alternatively the absolute value of the highest signal component, i.e. the peak amplitude, is also useful information that may be used to determine a burial status. For a subsea cable which is free-spanning the amplitude will generally be larger than for a buried cable as there will be expected to be side-to-side movement of the cable.

It will be understood that the wave spectrum, i.e. the frequency of the surface waves, will vary over time due to the conditions resulting in the waves, e.g. a distant storm. The frequency of the surface waves may depend on how far the waves have travelled with waves that have travelled more distance tending to have less high frequency component. The processing of the frequency spectra of the sensing portions of the sensing cable may therefore look at the relative energy in the high and low parts of the frequency spectra actually obtained. The ratio for a plurality of sensing portions may thus be compared to identify any significant differences or anomalies for one or more sensing portions which may indicate a different burial status.

In relatively open water, e.g. some distance from the coast or shoreline, it may be expected that the surface waves may have the same overall frequency spread across a relatively large area. Thus it would be expected that the frequency spectra from all sensing portions of the sensing fibre over this wide area would be substantially the same if the cable were buried to the same depth.

Closer to shore the surface waves at different parts of the cable may have different frequencies, which would thus lead to a different detected frequency spectrum. In such a case it may be preferable to only compare the frequency spectra from sensing portions that are relatively close to one another, say of the order of a few hundred meters or so. This still allows for a significant number of sensing portions to be considered together to identify any anomalies.

Embodiments of the invention thus use distributed fibre optic sensing, and in particular distributed fibre optic sensing based on coherent Rayleigh backscatter, to detect dynamic strains acting on the sensing fibre that result from pressure variations due to surface waves.

Distributed fibre optic sensing is a known technique where an optical fibre is deployed as a sensing fibre and interrogated with optical radiation. Backscatter from within the optical fibre in response to the interrogating radiation is detected and analysed to determine environmental stimuli acting on the fibre. By an appropriate choice of interrogating radiation and analysis the sensing fibre can be effectively divided into a plurality of discrete longitudinal portions.

One particular form of such sensor used in embodiments of the invention uses coherent interrogating radiation and detects any such radiation which undergoes Rayleigh scattering from within the fibre due to the scattering sites inherent in the optical fibre. The backscatter can be analysed to determine any dynamic strains acting on the optical fibre resulting from environmental stimuli acting on the fibre. Such sensing, when used to detect dynamic strains resulting from incident pressure waves or other mechanical vibration of the fibre, may be referred to as distributed acoustic sensing (DAS). Embodiments of the present invention may thus use the principles of coherent Rayleigh scatting based DAS.

FIG. 2 illustrates the principles of such a distributed fibre optic sensor 200. As noted above a length of sensing optical fibre 107 is removably connected at one end to an interrogator unit 108. The output from interrogator 108 may, in some embodiments, be passed to a signal processor 201, which may be co-located with or integrated into the interrogator or may be remote therefrom. Optionally there may also be a user interface/graphical display 202, which may be may be co-located with the signal processor or may be remote therefrom and in practice may be realised by an appropriately specified PC. The sensing fibre 107 can be many kilometres in length and can be, for instance be up to 40 km or more in length.

The sensing fibre may be a standard, unmodified single mode optic fibre such as is routinely used in telecommunications applications without the need for deliberately introduced reflection sites such a fibre Bragg grating or the like. The ability to use an unmodified length of standard optical fibre to provide sensing means that low cost readily available fibre may be used. However in some embodiments the optical fibre may comprise a fibre structure which has been fabricated to be especially sensitive to incident vibrations. The optical fibre will typically be protected by containing it with a cable structure, possibly as part of a bundle of optical fibres.

In use the sensing fibre 107 is deployed in an area of interest to be monitored which, in the present invention is along the path of a subsea cable such as power cable 100 or telecommunications cable for instance. The sensing fibre may be separate to the power cable and arranged to run generally along the length of the power cable. For instance a separate sensing fibre optic cable may be located to run alongside the power cable, for instance attached to the outside of the power cable. In some embodiments the sensing fibre could form part of the power cable structure and may, for instance, comprise an optical fibre already present in a power cable.

In operation the interrogator 108 launches coherent electromagnetic radiation into the sensing fibre, which will be referred to as interrogating radiation. The sensing fibre may, for instance, be repeatedly interrogated with pulses of optical radiation. In some embodiments a single pulse of optical radiation may be used for each interrogation, although in some embodiments multiple pulses may be used, in which case the optical pulses may have a frequency pattern as described in GB2,442,745 or optical characteristics such as described in WO2012/137022, the contents of which are hereby incorporated by reference thereto. Note that as used herein the term "optical" is not restricted to the visible spectrum and optical radiation includes infrared radiation and ultraviolet radiation. Any reference to "light" should also be construed accordingly.

The interrogator may therefore have at least one laser 203 and may comprise at least one optical modulator 204 for producing optical pulses. The interrogator also comprises at least one photodetector 205 arranged to detect radiation which is Rayleigh backscattered from the intrinsic scattering sites within the fibre 107. The signal from the photodetector may be processed by a processing module 206 of the interrogator unit to provide a measurement signal which is representative of disturbances acting on the fibre.

The phenomenon of Rayleigh backscattering results in some fraction of the interrogating optical radiation launched into the fibre being reflected back to the interrogator. As the interrogating radiation is coherent the Rayleigh backscatter received back at the interrogator at any instant is an interference signal of the backscatter generated within the sensing fibre from a particular position in the fibre. It will be noted this Rayleigh backscatter is generated by interaction between the interrogating radiation and inherent scatting sites present within the optical fibre. Thus the sensing function may be effectively distributed throughout the whole sensing fibre (although the returns are processed in time bins to provide results from individual sensing portions of the fibre). Such a sensor is therefore referred to as a distributed fibre optic sensor as the sensing is distributed throughout and intrinsic to the fibre itself. This is in contrast to sensors that used fibres having fibre Bragg gratings (FBGs) or similar deliberately introduced extrinsic reflection sites where the sensing function is provided in defined areas, typically as a point sensor.

The processing effectively divides the detected backscatter into a series of time bins based on the time after launch of the interrogating radiation. Each time bin may therefore corresponds to a different longitudinal sensing portion located at a different distance along the sensing fibre.

The backscatter radiation received at the detector for any given sensing portion of the optical fibre will depend on the distribution of the intrinsic sites within that portion of fibre, which is essential random. Thus the backscatter from one longitudinal sensing portion to the next will vary in a random fashion. However in the absence of an environmental stimulus acting on that section of the sensing fibre the backscatter signal received from one particular sensing portion will be the same from one interrogation to the next (assuming the characteristics of the interrogating radiation do not vary). However any disturbance on a given portion of the sensing fibre which results in a change of effective optical path of such sensing portion will alter the relative distribution of scattering sites and vary the interference signal from that section.

Thus the processing may analyse the backscatter from each of a plurality of sensing portions of the sensing fibre to detect variations in the backscatter between interrogations and use such variation as an indication of a disturbance acting on the fibre.

In some embodiments, especially those that use two spatially separated pulses per interrogation, the processing may determine a phase value for the interference signal received at the photodetector from a given sensing portion (or a demodulated version of the interference signal). The processor module may therefore demodulate the returned signal, e.g. based on any frequency difference between the optical pulses. The interrogator may operate as described in GB2,442,745 or WO2012/137022 for example or as described in WO2012/137021. The processor module may also apply a phase unwrap algorithm.

It will therefore be clear that dynamic disturbances or changes acting on the fibre that result in a change of effective optical path length can therefore be detected in each of a plurality of sensing portions of the optical fibre.

Such changes may be dynamic strains due to mechanical disturbances on the optical fibre, for instance from incident pressure waves. The distributed fibre optic sensor may therefore be operable as a distributed acoustic sensor which generates measurement signals indicative of acoustic disturbances acting on sensing portions of the sensing fibre. Note that as used herein the term acoustic shall be taken to mean any type of pressure wave or varying strain generated on the optical fibre and for the avoidance of doubt the term acoustic will be used in the specification to include mechanical vibrations.

The form of the optical input and the method of detection thus allows a single continuous optical fibre to be spatially resolved into discrete longitudinal sensing portions. That is, the measurement signal sensed at one sensing portion can be provided substantially independently of the sensed signal at an adjacent portion. As mentioned such a sensor may be seen as a fully distributed or intrinsic sensor, as it uses the intrinsic scattering processed inherent in an optical fibre and thus distributes the sensing function throughout the whole of the optical fibre. The spatial resolution of the sensing portions of optical fibre may, for example, be approximately 10 m or so, which for a continuous length of fibre of the order of 10 km say could provide 1000 independent channels along the length of the optical fibre.

As the sensing optical fibre is relatively inexpensive the sensing fibre may be deployed in a location in a permanent fashion as the costs of leaving the fibre in situ are not significant.

As mentioned above in embodiments of the present invention the sensing fibre is deployed along the path of a power cable to be monitored. A Rayleigh backscatter distributed fibre optic sensor interrogator unit 108 may be connected to one end of the sensing fibre, e.g. at power station 101 or power station 103, to monitor the cable in use to detect disturbances acting on the sensing fibre, in particular to perform distributed acoustic sensing. Thus up to 40 km or so of power cable could be monitored by a single interrogator which may be located on shore for example. For power cables of up to 80 km or length or so two interrogators could be arranged, one at each end of the power cable, i.e. one on the off-shore platform and one on shore. To avoid interference each interrogator could interrogate a separate sensing fibre within the power cable.

Figure 3:
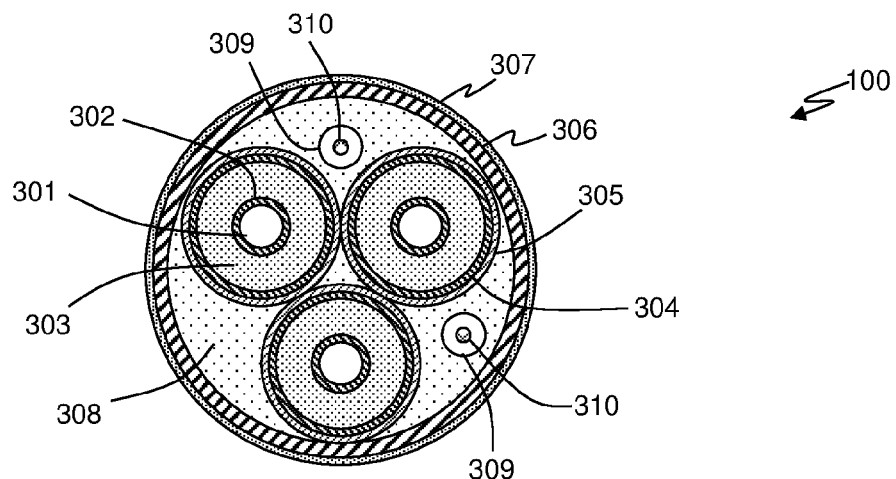
FIG. 3 illustrates one example of power cable with an optical fibre.

As noted above the sensing fibre may be implemented within the submarine cable, e.g. within power cable 100. FIG. 3 illustrates a cross section through an example power cable 100 such as may be used, for example, for medium or high voltage AC power transmission, i.e. voltages of tens or possible hundreds of kilovolts.

FIG. 3 illustrates that the cable may have three conductors 301, one for each AC phase, each of which may, for example, be formed from copper or a similar material. The conductors are each sheathed by at least one semi-conductive layer 302 which is surrounded by a respective insulator 303 such as XLPE (cross-linked polyethylene). Each insulator 303 may be surrounded by one or more sheathing layers 304 and 305, which may, for example, include at least one semi-conductive sheathing layer 304. The three conductors, with their associated sheathing and insulation layers, are all contained within an armour layer 306 which may for instance comprise a braiding of galvanised steel wires to provide protection for the power cable. The power cable may also have an outer jacket layer 307 such as a polypropylene yarn cladding. There may be filler material 308 within the cable, which may comprise a plurality of elongate filler elements disposed inward of the armour layer 306. This can give the overall power cable a desired form and ensure the sheathed conductors are held in place within the power cable, as well as providing additional padding/protection.

Additionally it is common to embed at least one optical fibre within the cable, or at least provide the ability for optical fibres to be located within the power cable, for instance to allow for data communication between the various power stations linked by the cable. Thus there may be at least one fibre optic conduit 309 for carrying one or more optical fibres 110, and typically a bundle of optical fibres. One of the optical fibres 310 may be used as the sensing fibre 310.

FIG. 4 illustrates data from a DAS sensor of the type described with reference to FIG. 2 obtained from interrogating a sensing optical fibre deployed in the sea with part of the sensing fibre buried and part of the sensing fibre exposed or free-spanning on the seabed.

Figure 4A:
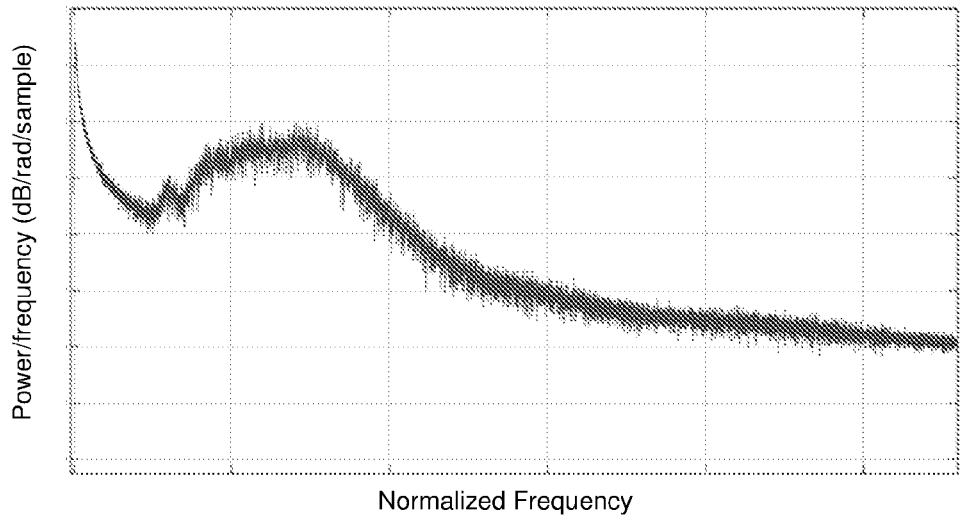
FIGS. 4a and 4b illustrate example data obtained using a subsea sensing fibre.
Figure 4B:
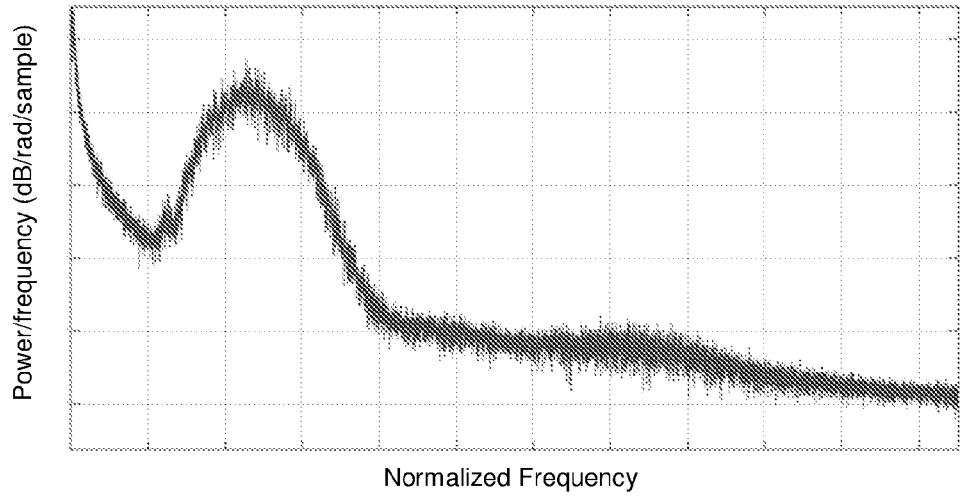

FIG. 4a shows the frequency spectrum for the measurement signals obtained from a first sensing portion of the sensing fibre which was unburied and fee-spanning within the sea whereas FIG. 4b illustrates the frequency spectrum for the measurement signals obtained from a second sensing portion of the sensing fibre which was buried in sand on the seabed to a depth of about 0.5 m to 1 m. In each case the power/amplitude of the measurement signal (in dB) at a particular frequency is plotted against a normalised frequency value. FIGS. 4a and 4b show a plot over a frequency range from zero to about 0.55 Hz.

It can be seen that both frequency spectrums illustrate the same general pattern and exhibit a local maximum at approximately the same frequency. The frequency spectrum of FIG. 4a exhibits more power overall—the local maximum reaches a peak of around 135 dB in FIG. 4a whereas the equivalent maximum in FIG. 4b is about 112 dB. It can be seen particularly however that there is a significantly greater proportion of energy at higher frequencies, e.g. above 0.15 Hz in FIG. 4a than FIG. 4b. In FIG. 4a, for the unburied cable, the signal energy at 0.02 Hz (a low frequency) is about 13 dB lower than the signal energy at 0.12 Hz (a high frequency) whereas in FIG. 4b, for the buried cable, the relative difference in signal energy at these frequencies is about 30 dB.

This illustrates that frequency spectrum and especially the high frequency components thereof are significantly attenuated when the sensing fibre is buried and indicates that analysing the frequency spectrum can be used to determine burial status.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:
1. A method of monitoring a sub sea cable comprising:
performing distributed fibre optic sensing on a sensing optical fibre to provide a measurement signal from each of a plurality of longitudinal sensing portions of the sensing optical fibre, the sensing optical fibre being deployed along the path of the subsea cable; and for at least one sensing portion, analysing a frequency spectrum of the respective measurement signal corresponding to pressure variations due to surface water waves to determine a burial status for that sensing portion.

2. A method as claimed in claim 1 wherein analysing the frequency spectrum of the measurement signal comprises determining an indication of relative attenuation of the measurement signal at different frequencies.

3. A method as claimed in claim 1 wherein analysing the frequency spectrum of the measurement signal comprises comparing the frequency spectrum to at least one reference frequency spectrum for a known burial status.

4. A method as claimed in claim 1 wherein analysing the frequency spectrum of the measurement signal comprises comparing the frequency spectrum for one sensing portion to a frequency spectrum for a different sensing portion to determine a relative burial status for the two sensing portions.

5. A method as claimed in claim 1 wherein analysing the frequency spectrum of the measurement signal comprises comparing the energy or amplitude of the measurement signal at a first frequency or within a first frequency band and the energy or amplitude of the measurement signal at a second different frequency or frequency band.

6. A method as claimed in claim 1 wherein analysing the frequency spectrum of the measurement signal comprises determining a value for a spectrum parameter corresponding to a ratio between signal energy at a first frequency or first frequency band and signal energy at a second frequency or second frequency band.

7. A method as claimed in claim 6 comprising comparing said spectrum parameter to at least one reference value for a known burial status.

8. A method as claimed in claim 6 comprising comparing said spectrum parameter to a corresponding spectrum parameter for the measurement signal for another different sensing portion and determining a relative burial status for the two sensing portions.

9. A method as claimed in claim 5 wherein the first frequency or first frequency band is a frequency or band of frequencies that is within a low frequency band and the second frequency or second frequency band is a frequency or range of frequencies that is within a high frequency band.

10. A method as claimed in claim 5 wherein the first frequency is 0.1 Hz or lower and the second frequency is 0.1 Hz or higher.

11. A method as claimed in claim 1 wherein the subsea cable is coupled to or forms part of a submarine power cable.

12. An apparatus for monitoring a subsea cable comprising:
a distributed fibre optic interrogator unit for interrogating a sensing optical fibre deployed along the path of the sub sea cable to provide a measurement signal from each of a plurality of longitudinal sensing portions of the sensing optical fibre; and
an analyser configured to analyse, for at least one sensing portion, a frequency spectrum of the respective measurement signal corresponding to pressure variations due to surface water waves to determine a burial status for that sensing portion.

13. An apparatus as claimed in claim 12 wherein the analyser is configured to determine an indication of relative attenuation of the measurement signal at different frequencies.

14. An apparatus as claimed in claim 12 wherein the analyser is configured to compare the frequency spectrum to at least one reference frequency spectrum for a known burial status.

15. An apparatus as claimed in claim 12 wherein the analyser is configured to compare the frequency spectrum for one sensing portion to a frequency spectrum for a different sensing portion to determine a relative burial status for the two sensing portions.

16. An apparatus as claimed in claim 12 wherein the analyser is configured to compare the energy or amplitude of the measurement signal at a first frequency or within a first frequency band and the energy or amplitude of the measurement signal at a second different frequency or frequency band.

17. An apparatus as claimed in claim 12 wherein the analyser is configured to determine a value for a spectrum parameter corresponding to a ratio between signal energy at a first frequency or first frequency band and signal energy at a second frequency or second frequency band.

18. An apparatus as claimed in claim 17 wherein the analyser is configured to compare said spectrum parameter to at least one reference value for a known burial status.

19. An apparatus as claimed in claim 12 comprising a sensing optical fibre connected to said distributed fibre optic interrogator unit.

20. An apparatus as claimed in claim 19 wherein said sensing fibre is coupled to or forms part of a subsea cable.

* * * * *